(12) United States Patent
Donovan et al.

(10) Patent No.: US 8,564,065 B2
(45) Date of Patent: Oct. 22, 2013

(54) CIRCUIT ARCHITECTURE FOR METAL OXIDE SEMICONDUCTOR (MOS) OUTPUT DRIVER ELECTRICAL OVERSTRESS SELF-PROTECTION

(75) Inventors: Colm Donovan, Valencia (ES); Javier A Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 255 days.

(21) Appl. No.: 13/152,867

(22) Filed: Jun. 3, 2011

(65) Prior Publication Data

US 2012/0306013 A1 Dec. 6, 2012

(51) Int. Cl.
*H01L 23/62* (2006.01)
(52) U.S. Cl.
USPC .................. 257/355; 257/369; 257/E27.016
(58) Field of Classification Search
USPC .................. 257/338, 369, 355–357, E27.016; 361/98, 101, 56, 57
See application file for complete search history.

(56) References Cited

U.S. PATENT DOCUMENTS

| | | | |
|---|---|---|---|
| 7,485,930 B2* | 2/2009 | Lee et al. ................ | 257/355 |
| 7,671,411 B2* | 3/2010 | You et al. ................ | 257/343 |
| 2006/0232318 A1 | 10/2006 | Iwahori et al. | |
| 2008/0029824 A1 | 2/2008 | Baizley et al. | |
| 2009/0161274 A1 | 6/2009 | Huang et al. | |
| 2009/0195951 A1 | 8/2009 | Sorgeloos et al. | |
| 2009/0316316 A1 | 12/2009 | Shiota | |
| 2010/0123985 A1 | 5/2010 | Wang et al. | |

* cited by examiner

*Primary Examiner* — Matthew Landau
*Assistant Examiner* — Candice Y Chan
(74) *Attorney, Agent, or Firm* — Knobbe, Martens, Olson & Bear, LLP

(57) ABSTRACT

Metal oxide semiconductor (MOS) protection circuits and methods of forming the same are disclosed. In one embodiment, an integrated circuit includes a pad, a p-type MOS (PMOS) transistor, and first and second n-type MOS (NMOS) transistors. The first NMOS transistor includes a drain, a source and a gate electrically connected to the pad, a first supply voltage, and a drain of the PMOS transistor, respectively. The second NMOS transistor includes a gate, a drain, and a source electrically connected to a bias node, a second supply voltage, and a source of the PMOS transistor, respectively. The source of the second NMOS transistor is further electrically connected to a body of the PMOS transistor so as to prevent a current flowing from the drain of the PMOS transistor to the second supply voltage through the body of PMOS transistor when a transient signal event is received on the pad.

19 Claims, 10 Drawing Sheets

CIRCUIT ARCHITECTURE FOR METAL OXIDE SEMICONDUCTOR (MOS) OUTPUT DRIVER ELECTRICAL OVERSTRESS SELF-PROTECTION

BACKGROUND

1. Field

Embodiments of the invention relate to electronic systems, and more particularly, to metal oxide semiconductor (MOS) output circuits for electronic systems.

2. Description of the Related Technology

Certain electronic systems can be exposed to a transient signal event, or an electrical signal of a relatively short duration having rapidly changing voltage and high power. Transient signal events can include, for example, electrostatic discharge (ESD) events arising from the abrupt release of charge from an object or person to an electronic system.

Transient signal events can damage portions of integrated circuits (ICs) inside an electronic system, such as output driver circuits, due to overvoltage conditions and/or high levels of power dissipation over relatively small areas of the ICs. High power dissipation can increase IC temperature, and can lead to numerous reliability problems, such as gate oxide punch-through, junction damage, metal damage, and/or surface charge accumulation. Moreover, transient signal events can induce latch-up (in other words, inadvertent creation of a low-impedance path), thereby disrupting the functioning of the IC and potentially causing permanent damage to the IC. Thus, there is a need to provide an IC, including output drivers connected to a pin or pad of the IC, with the ability to safely discharge high power transient signal events without impacting the functionality and/or reliability of the IC.

SUMMARY

Metal oxide semiconductor (MOS) output circuits and methods of forming the same are provided. In one embodiment, an integrated circuit is provided. The integrated circuit includes a first pad disposed above a surface of a substrate and a first MOS transistor of the substrate and of a first type. The first MOS transistor includes a gate, a source and a drain, the drain electrically connected to the first pad and the source electrically connected to a first supply voltage. The integrated circuit further includes a second MOS transistor of the substrate and of a second type opposite the first type. The second MOS transistor includes a gate, a source, a drain, and a body, the gate configured to receive a control signal and the drain electrically connected to the gate of the first MOS transistor. The integrated circuit further includes a third MOS transistor of the substrate and of the first type. The third MOS transistor includes a gate, a drain, a source and a body, the gate configured to receive a bias signal, the drain electrically connected to a second supply voltage, the source electrically connected to the source of the second MOS transistor, and the body electrically connected to a first reference voltage. The body of the second MOS transistor is electrically connected to the source of the third MOS transistor so as to prevent a current flowing from the drain of the second MOS transistor to the second supply voltage through the body of second MOS transistor when a transient signal event is received on the first pad.

In another embodiment, a method for providing protection from transient signal events is provided. The method includes forming a first pad above a surface of a substrate and forming a first MOS transistor on the substrate. The first MOS transistor is of a first type and includes a gate, a source and a drain, the drain electrically connected to the first pad and the source electrically connected to a first supply voltage. The method further includes forming a second MOS transistor on the substrate, the second MOS transistor of a second type opposite the first type. The second MOS transistor includes a gate, a source, a drain, and a body, the gate configured to receive a control signal and the drain electrically connected to the gate of the first MOS transistor. The method further includes forming a third MOS transistor on the substrate, the third MOS transistor of the first type. The third MOS transistor includes a gate, a drain, a source and a body, the gate configured to receive a bias signal, the drain electrically connected to a second supply voltage, the source electrically connected to the source of the second MOS transistor, and the body electrically connected to a first reference voltage. The body of the second MOS transistor is electrically connected to the source of the third MOS transistor so as to prevent a current flowing from the drain of the second MOS transistor to the second supply voltage through the body of second MOS transistor when a transient signal event is received on the first pad.

DETAILED DESCRIPTION OF EMBODIMENTS

Figure 1A:
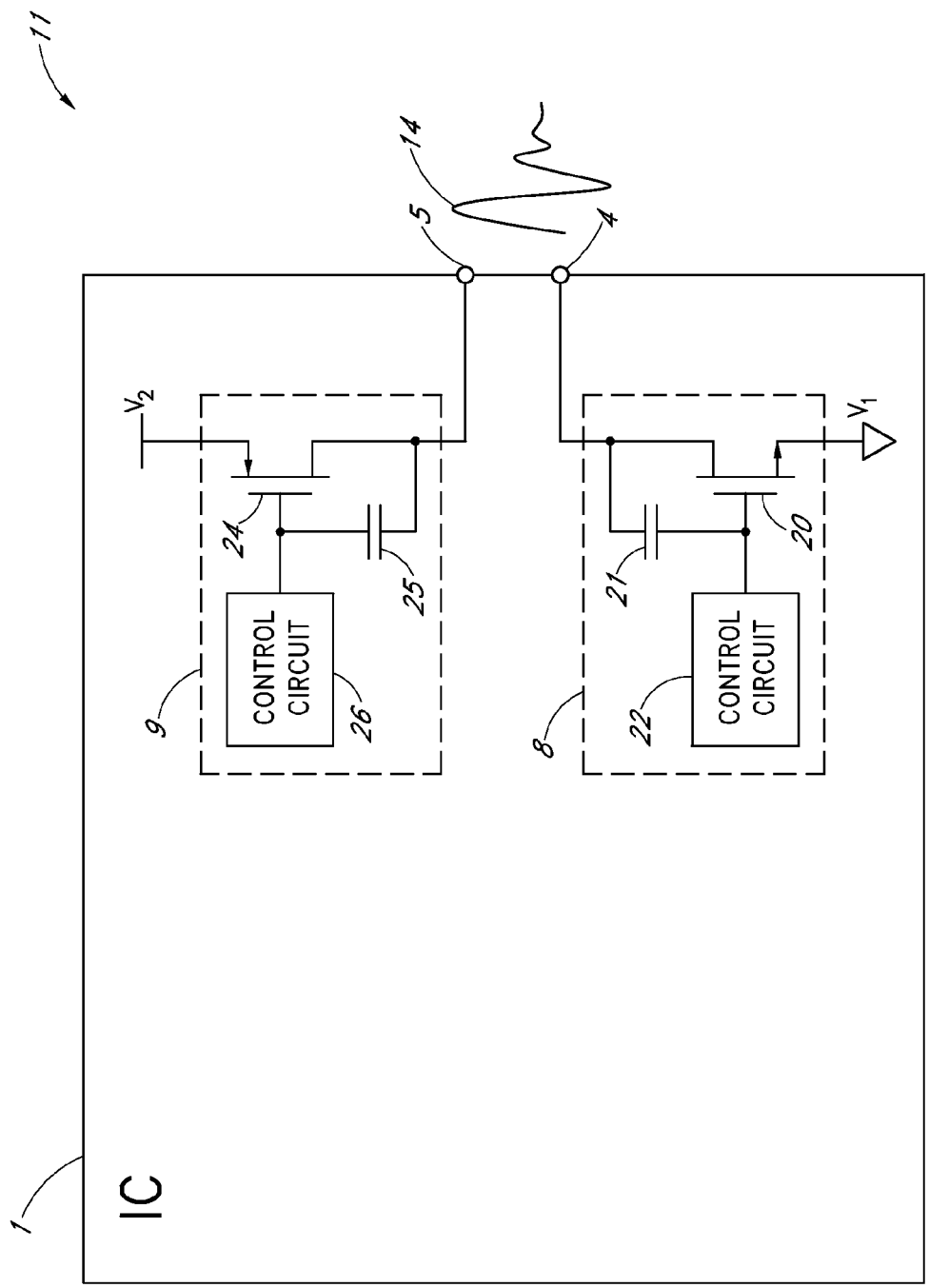
FIG. 1A is a schematic block diagram of one example of an electronic system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Electronic systems are typically configured to protect circuits or components therein from transient signal events. Furthermore, to help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide range of transient signal events, including ESD events.

Electronic circuit reliability can be providing using devices that are self-protecting, or that do not require a separate structure to provide transient signal protection. For example, a field effect transistor, such as an NMOS or PMOS transistor, can be configured to function in an electrical circuit during normal operation of the IC and to provide transient signal protection alone or in combination with other components during a transient signal event. By including devices that are self-protecting in an IC, an electronic system can meet reliability and performance requirements with low manufacturing cost and a relatively small circuit area.

Overview of Various Examples of Electronic Systems

FIG. 1A is a schematic block diagram of one example of an electronic system 11, which can include one or more protection circuits according to various embodiments. The illustrated electronic system 11 includes an integrated circuit (IC) 1, which includes first and second pins or pads 4, 5 and first and second output driver circuits 8, 9.

The first output driver circuit 8 is electrically connected to the first pad 4, and includes an NMOS transistor 20, a first capacitor 21, and a first control circuit 22. In certain implementations, the NMOS transistor can be a high voltage MOS (HV-MOS) device, including, for instance, a drain-extended MOS transistor, such as a double-diffused MOS (DMOS) transistor. The NMOS transistor 20 includes a source electrically connected to a first supply voltage $V_1$, which can be, for example, a ground or negative supply voltage. The NMOS transistor 20 further includes a gate electrically connected to the first control circuit 22 and to a first end of the first capacitor 21, and a drain electrically connected to a second end of the first capacitor 21 and to the first pad 4. The first capacitor 21 can represent, for example, parasitic capacitance between metal interconnect and/or diffusion regions of the drain of the NMOS transistor 20 and metal and/or poly-silicon structures of the gate of the NMOS transistor 20. However, in certain implementations, the first capacitor 21 can be formed from other structures.

The second output driver circuit 9 is electrically connected to the second pad 5, and includes a PMOS transistor 24, a second capacitor 25, and a second control circuit 26. The PMOS transistor 24 includes a source electrically connected to a second supply voltage $V_2$, which can be, for example, a positive supply voltage. The PMOS transistor 24 further includes a gate electrically connected to the second control circuit 26 and to a first end of the second capacitor 25, and a drain electrically connected to a second end of the second capacitor 25 and to the second pad 5. The second capacitor 25 can represent, for example, parasitic capacitance between metal interconnect and/or diffusion regions of the drain of the PMOS transistor 24 and metal and/or polysilicon structures of the gate of the PMOS transistor 24. However, in certain implementations, the second capacitor 25 can be formed from other structures.

The first and second output driver circuits 8, 9 can be used to communicate signals from the IC 1 using the first and second pads 4, 5, respectively. For example, the control circuits 22, 26 can be used to control the state of the NMOS and PMOS transistors 20, 24, respectively, thereby controlling the electrical potential of the first and second pads 4, 5. Additionally, the first and second control circuits 22, 26 can also be used to control the state of the NMOS and PMOS transistor 20, 24 during a power-up condition, such as an initialization of the first and/or second supply voltages $V_1$, $V_2$.

The first and second pins 4, 5 of the IC 1 can be exposed to transient signal events, such as ESD events, which can cause IC damage and induce latch-up when the transient signal events are not protected against. For example, the first and/or second pads 4, 5 can receive a transient signal event 14. The NMOS and PMOS transistors 20, 24 can provide protection to the first and second output driver circuits 8, 9 during a transient signal event, as will be described below. Thus, not only can the NMOS and PMOS transistors 20, 24 provide signaling functionality during normal operation, the NMOS and PMOS transistors 20, 24 can operate as devices that are self-protecting during a transient signal event. Including self-protecting NMOS and PMOS transistor 20, 24 on the IC 1 can aid in providing output drivers and/or other circuits that have a relatively small area relative to a scheme employing a separate protection devices.

During a transient signal event, the first and second capacitors 21, 25 can provide a displacement or coupling current that can aid in providing transient signal event protection using the NMOS and PMOS transistors 20, 24. For example, the first capacitor 21 can couple the gate of the NMOS transistor 20 in response to a sudden change in voltage on the first pad 4, such as voltage changes associated with a transient signal event. For instance, during a transient signal event, the first capacitor 21 can inject a current I from the drain to the gate of the NMOS transistor 20 that is equal to about $C_{21}*dV_4/dt$, where $C_{21}$ is the capacitance of the first capacitor 21 and $dV_4/dt$ is the rate of voltage change at the first pad 4. In response to transient signal events that change the voltage of the first pad 4 at a certain rate and duration, the first capacitor 21 can increase voltage of the gate of the NMOS transistor 20 by charging the effective gate-to-source capacitance to a level sufficient for the gate-source voltage of the NMOS transistor 20 to exceed the threshold voltage of the NMOS transistor 20. Thus, for a transient signal event of a sufficient rate of voltage change and duration, the first capacitor 21 can be used to couple the gate voltage of the NMOS transistor 20 to a level sufficient to transition the NMOS transistor 20 to a low-impedance on-state. When the NMOS transistor 20 is turned on, the NMOS transistor 20 can conduct a drain-source current through a low impedance channel so as to reduce the voltage magnitude of the first pad 4 and to create a low impedance discharge path between the drain and the source of the NMOS transistor 20 for the transient signal event 14. Similarly, the second capacitor 25 can provide a displacement current that can aid in providing transient signal event protection using the PMOS transistor 24.

The protection circuit of FIG. 1A illustrates a configuration in which the first and second output driver circuits 8, 9 are electrically connected to the first and second pads 4, 5, respectively. In this configuration, the IC 1 can be used in a wide variety of electronic systems and applications, including, for example, electronic systems that include a controller area network (CAN) interface. However, persons having ordinary skill in the art will appreciate that the IC 1 can be adapted for use in other systems. For example, when the IC 1 is used in a system configured to operate over a local interconnect network (LIN) interface, the first and second output driver circuits 8, 9 can be modified so as to be electrically connected to the same pad.

Figure 1B:
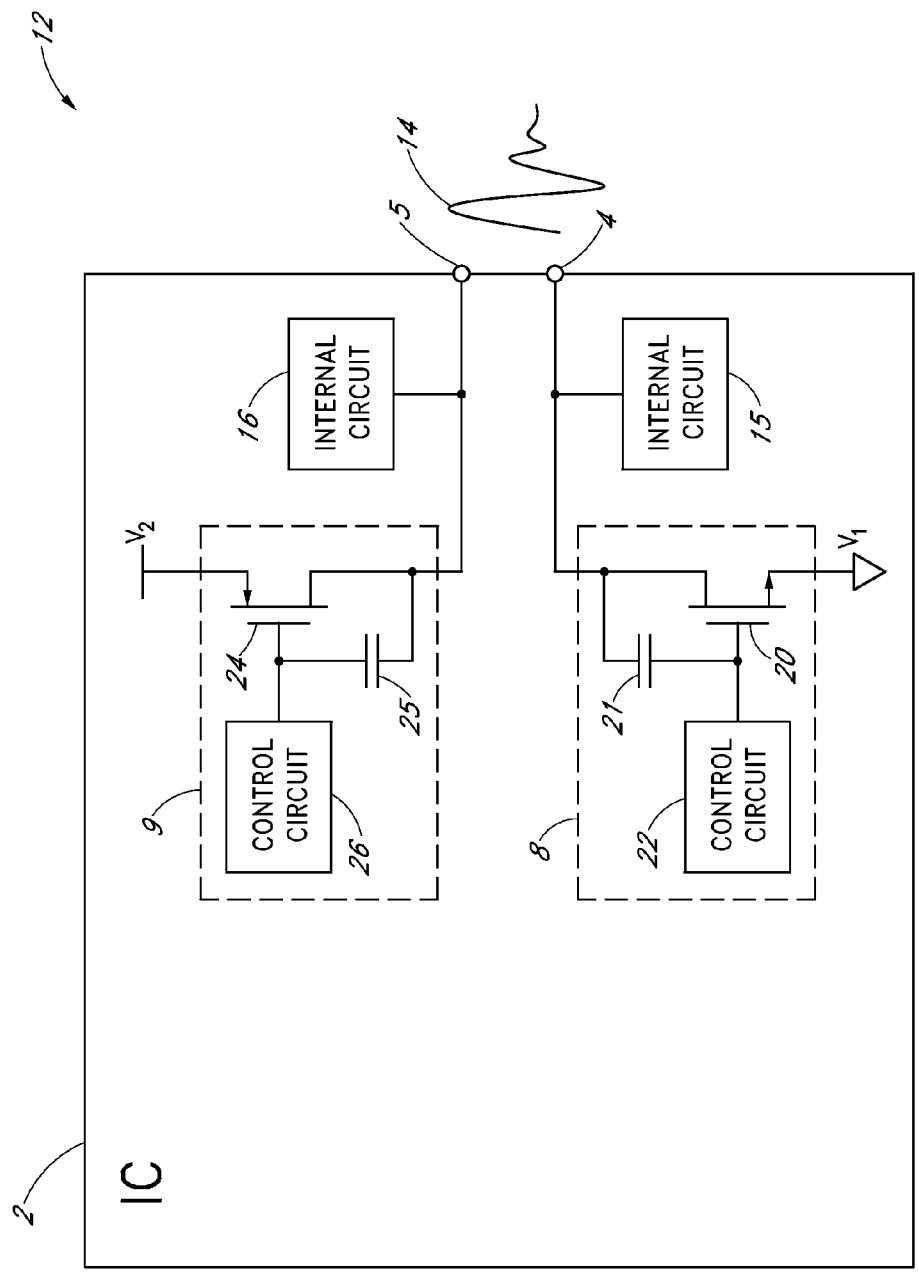
FIG. 1B is a schematic block diagram of another example of an electronic system.

FIG. 1B is a schematic block diagram of another example of an electronic system 12. The illustrated electronic system 12 includes an IC 2, which includes first and second pins or pads 4, 5, first and second output driver circuits 8, 9, and first and second internal circuits 15, 16. The electronic system 12 of FIG. 1B is similar to the electronic system 11 of FIG. 1A, except that the IC 2 of FIG. 1B further includes the first and second internal circuits 15, 16, which are electrically connected to the first and second pads 4, 5, respectively. As illustrated in FIG. 1B, the NMOS transistor 20 can provide protection to both the first output driver circuit 8 and to the first internal circuit 15 of the IC 2. Likewise, the PMOS transistor 24 can provide protection to both the second output driver circuit 9 and to the second internal circuit 16 of the IC 2. Thus, in certain implementations, the NMOS and PMOS transistor 20, 24 can be used to provide not only self-protection, but protection to other circuits and/or structures as well.

Figure 1C:
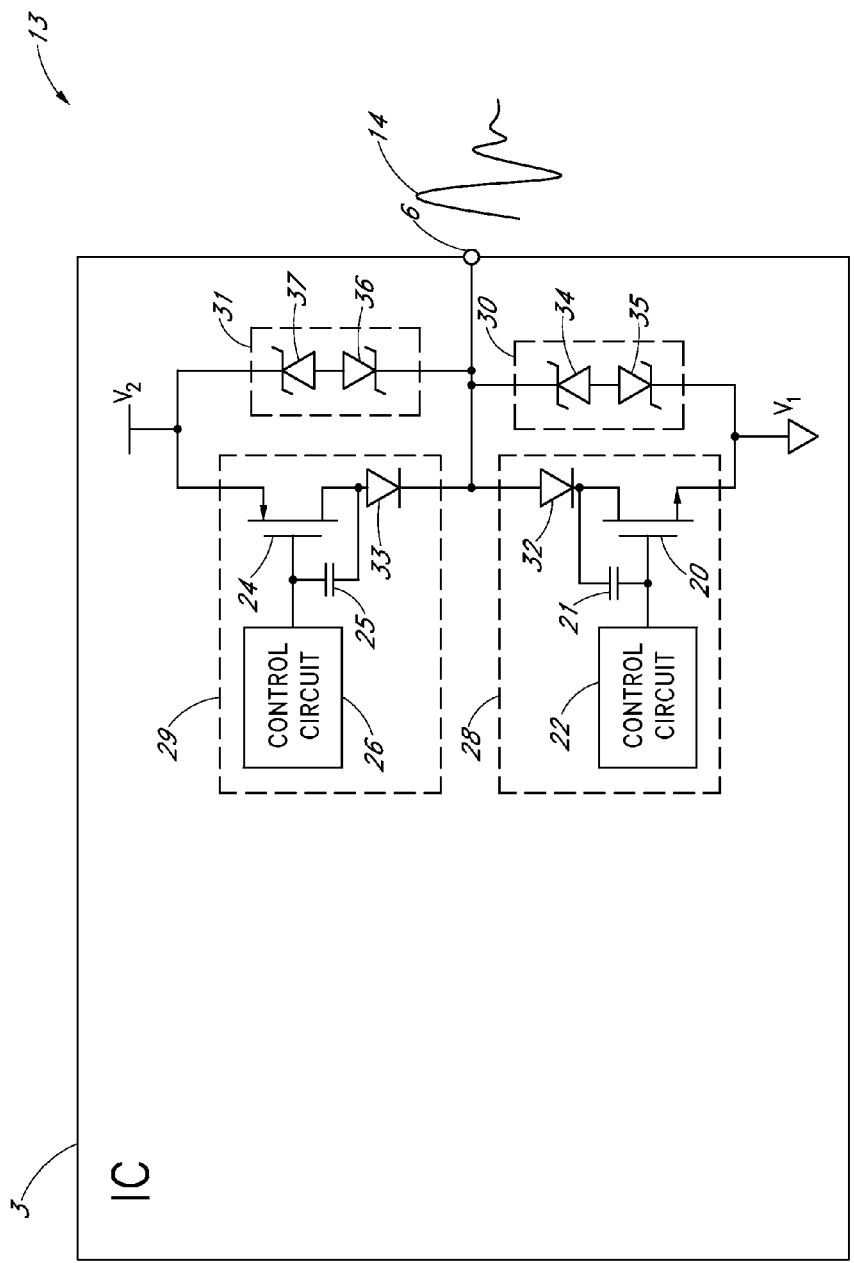
FIG. 1C is a schematic block diagram of yet another example of an electronic system.

FIG. 1C is a schematic block diagram of yet another example of an electronic system 13. The illustrated electronic system 13 includes an IC 3, which includes a pad 6, first and second output driver circuits 28 and 29, and first and second auxiliary protection circuits 30, 31.

The first output driver circuit 28 is electrically connected to the pad 6, and includes an NMOS transistor 20, a first capacitor 21, a first control circuit 22, and a first blocking diode 32. The NMOS transistor 20 includes a source electrically connected to the first supply voltage $V_1$, a gate electrically connected to the first control circuit 22 and to the first end of the first capacitor 21, and a drain electrically connected to the second end of the first capacitor 21 and to a cathode of the first blocking diode 32. The first blocking diode 32 further includes an anode electrically connected to the pad 6. The first output driver circuit 28 is similar to the first output driver circuit 8 of FIGS. 1A-1B, except that the first output driver circuit 28 further includes the first blocking diode 32 inserted between the pad 6 and the drain of the NMOS transistor 20. The first blocking diode 32 can help prevent conduction through the body of the NMOS transistor 20 for systems in which the pin 6 has a voltage level that can be below the reference voltage $V_1$ during normal operation. Inclusion of the first blocking diode 32 in the first output driver circuit 28 can aid in preventing transient signal events that would otherwise decrease the voltage of the pad 6 from coupling onto the gate of the NMOS transistor 20, and can be useful when implementing a protection scheme for pins operating with large positive/negative voltage levels using both MOS transistors and auxiliary protection circuits, as will be described in detail below.

The second output driver circuit 29 is electrically connected to the pad 6, and includes a PMOS transistor 24, a second capacitor 25, a second control circuit 26, and a second blocking diode 33. The PMOS transistor 24 includes a source electrically connected to the second supply voltage $V_2$, a gate electrically connected to the second control circuit 26 and to the first end of the second capacitor 25, and a drain electrically connected to the second end of the second capacitor 25 and to an anode of the second blocking diode 33. The second blocking diode 33 further includes a cathode electrically connected to the pad 6. The second output driver circuit 29 is similar to the second output driver circuit 9 of FIGS. 1A-1B, except that the second output driver circuit 29 further includes the second blocking diode 33 inserted between the pad 6 and the drain of the PMOS transistor 24. The second blocking diode 33 can help prevent conduction through the body of the PMOS transistor 24 for systems in which the pin 6 has a voltage level that can be above the reference voltage $V_2$ during normal operation. Inclusion of the second blocking diode 33 in the second output driver circuit 29 can aid in preventing transient signal events that would otherwise increase the voltage of the pad 6 from coupling onto the gate of the PMOS transistor 24, and can be useful when implementing a protection scheme for pins operating with large positive/negative voltage levels using both MOS transistors and auxiliary protection circuits, as will be described in detail below.

The first auxiliary protection circuit 30 includes a third blocking diode 34 and a fourth blocking diode 35. The third blocking diode 34 includes a cathode electrically connected to the pad 6 and an anode electrically connected to an anode of the fourth blocking diode 35. The fourth blocking diode 35 further includes a cathode electrically connected to the first supply voltage $V_1$. The first auxiliary protection circuit 30 can provide protection against both positive transient signal events that increase the voltage of the pad 6 above the predetermined blocking voltage of the third blocking diode 34 and against negative transient signal events that decrease the voltage of the pad 6 below the predetermined blocking voltage of the fourth blocking diode 35. For example, when a transient signal event increases the voltage of the pad 6, the first auxiliary protection circuit 30 can reach a breakdown condition in which the fourth blocking diode 35 becomes forward-biased and the third blocking diode 34 reaches a breakdown condition, such as avalanche and/or Zener-type breakdown depending on, for example, the operating voltage level. Similarly, when a transient signal event decreases the voltage of the pad 6, the first auxiliary protection circuit 30 can reach a breakdown condition in which the third blocking diode 34 becomes forward-biased and the fourth blocking diode 35 reaches a breakdown condition.

The second auxiliary protection circuit 31 includes a fifth blocking diode 36 and a sixth blocking diode 37. The fifth blocking diode 36 includes a cathode electrically connected to the pad 6 and an anode electrically connected to an anode of the sixth blocking diode 37. The sixth blocking diode 37 further includes a cathode electrically connected to the second supply voltage $V_2$. The second auxiliary protection circuit 31 can provide bi-directional protection against transient signal events in a manner similar to that described above with reference to the first auxiliary protection circuit 30.

The first and second output driver circuits 28, 29 and the first and second auxiliary protection circuits 30, 31 can be used in a configuration in which both the NMOS and PMOS transistors 20, 24 and the first and second auxiliary protection circuits 30, 31 are used to provide transient signal event protection. For example, as previously indicated, the NMOS and PMOS transistors 20, 24 can each be double-diffused MOS (DMOS) and/or high voltage MOS (HV-MOS) transistors that may occupy a relatively large amount of area of the IC 3 when they are sized to provide transient signal event protection alone. Thus, in certain implementations, MOS devices can be used in combination with other auxiliary protection devices that are sized and/or otherwise optimized to reach a target protection performance characteristic, thereby minimizing circuit area relative to a scheme using structures that sustain stress independently.

FIG. 1C shows a configuration in which the first and second output driver circuits 28, 29 are electrically connected to the same pad 6, and thus the illustrated IC 3 can be suitable for a variety of applications, including, for example, configurations in which the pad 6 is electrically connected to a local interconnect network (LIN) interface. However, the first and second output driver circuits 28, 29 can be electrically connected to different pads, such as when the IC 3 is employed in an electronic system using a controller area network (CAN) interface. For example, the first output driver circuit 28 and the first auxiliary protection circuit 30 can be electrically connected to a first pad, and the second output driver circuit 29 and the second auxiliary protection circuit 31 can be electrically connected to a second pad.

Figure 2:
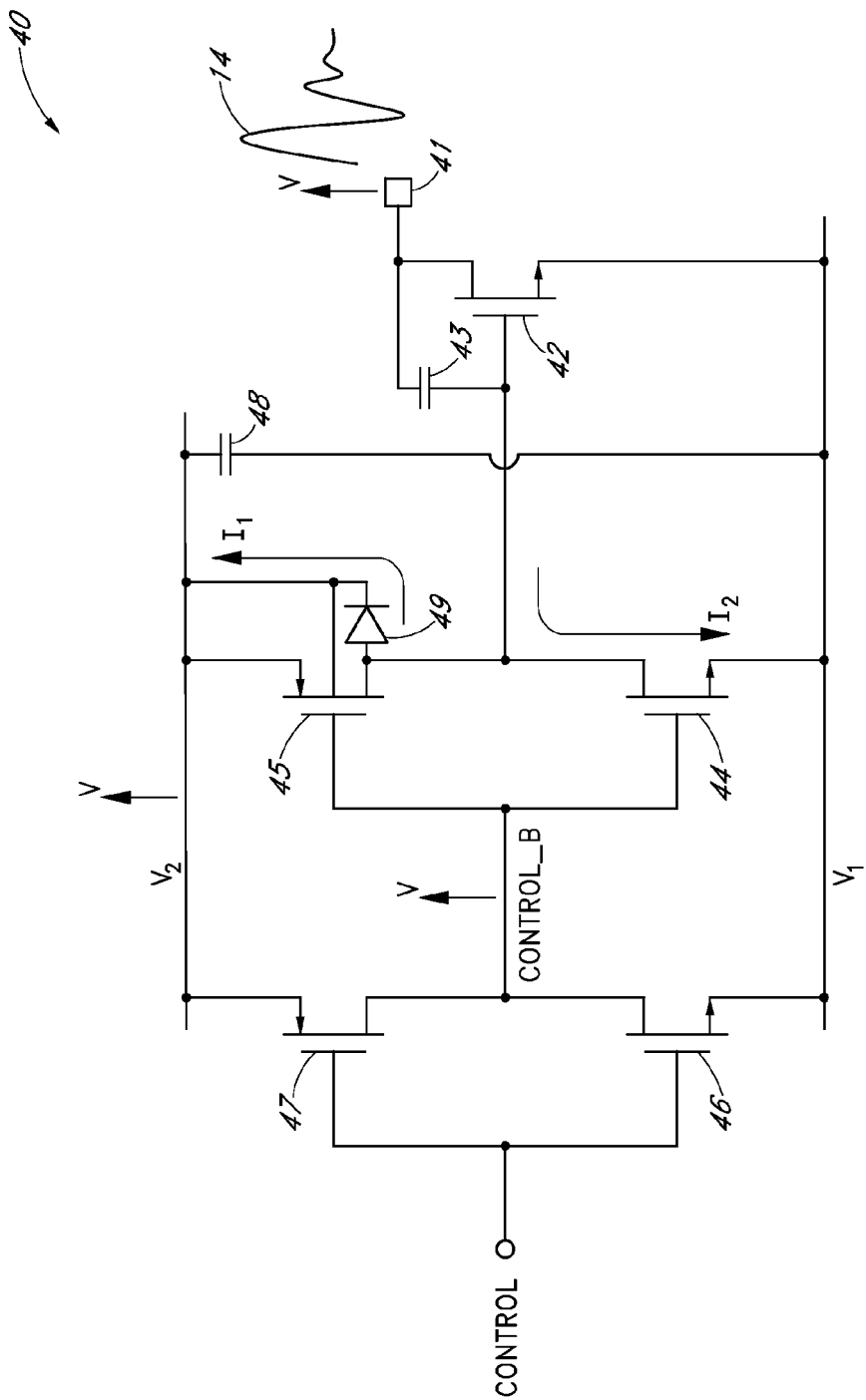
FIG. 2 is an annotated circuit diagram of an example of a portion of an integrated circuit that includes a pad and an n-type metal oxide semiconductor (NMOS) transistor.

FIG. 2 is an annotated circuit diagram of an example of a portion of an integrated circuit 40. The integrated circuit 40 includes a pad 41, a first NMOS transistor 42, a second NMOS transistor 44, a first PMOS transistor 45, a third NMOS transistor 46, and a second PMOS transistor 47. The circuit 40 has been annotated to show a transient signal event 14 received on the pad 41, as well as a variety of parasitic devices that can be within the circuit, such as a first capacitor 43, a second capacitor 48, and a p-n junction diode 49.

The first NMOS transistor 42 includes a drain electrically connected to the pad 41, a source electrically connected to the first supply voltage $V_1$, and a gate electrically connected to a drain of the second NMOS transistor 44 and to a drain of the first PMOS transistor 45. The second NMOS transistor 44 further includes a source electrically connected to the first supply voltage $V_1$ and a gate electrically connected to a gate of the first PMOS transistor 45, to a drain of the third NMOS transistor 46, and to a drain of the second PMOS transistor 47 at a node labeled CONTROL_B. The first PMOS transistor 45 further includes a source electrically connected to the second supply voltage $V_2$. The third NMOS transistor 46 further includes a source electrically connected to the first supply voltage $V_1$ and a gate electrically connected to a gate of the second PMOS transistor 47 and configured to receive a control signal CONTROL. The second PMOS transistor 47 further includes a source electrically connected to the second supply voltage $V_2$.

The first capacitor 43, the second capacitor 48, and the p-n junction diode 49 can represent parasitic devices of the illustrated circuit. For example, the first capacitor 43 includes a first end electrically connected to the drain of the first NMOS transistor 42 and a second end electrically connected to the gate of the first NMOS transistor 42, and can represent the parasitic capacitance between metal interconnect and/or diffusion regions of the drain of the first NMOS transistor 42 and metal and/or polysilicon structures of the gate of the first NMOS transistor 42. Additionally, the second capacitor 48 includes a first end electrically connected to the first power supply voltage $V_1$ and a second end electrically connected to the second power supply voltage $V_2$, and can represent the parasitic capacitance between the first and second power supply voltages $V_1, V_2$, such as parasitic capacitance arising from power supply interconnect and/or between portions of the substrate and/or wells that are electrically connected to the first and second power supply voltages $V_1, V_2$. The p-n junction diode 49 can represent a parasitic diode formation arising from the junction formed between the drain and body of the first PMOS transistor 45.

When a transient signal event 14 is received on the pad 41 and causes the voltage of the pad 41 to increase, the change in voltage can cause the first capacitor 43 to couple the gate voltage of the first NMOS transistor 42 upwards. For transient signal events having a sufficient rate of voltage change and duration, the gate of the first NMOS transistor 41 can be increased to a level at which the first NMOS transistor 42 becomes conductive and conducts a source-drain current that shunts charge associated with the transient signal event 14 and reduces the voltage of the pad 41. Thus, the first NMOS transistor 42 can be used to maintain the voltage of the pad 41 within a safe range of operation and to avoid the build-up of a relatively large voltage between the drain and the source of the first NMOS transistor 42 that can cause destructive breakdown.

However, the circuit 40 can include parasitic discharge paths that can cause the gate of the first NMOS transistor 42 to be pulled-down during a transient signal event. For example, as the gate voltage of the first NMOS transistor 42 rises during a transient signal event, the voltage of the drain of the first PMOS transistor 45 can rise above that of the body of the first PMOS transistor 45, thereby forward-biasing the p-n junction diode 49. As the p-n junction diode 49 becomes forward biased, a current $I_1$ can flow through the p-n junction diode 49 and onto the second supply voltage $V_2^*$, thereby charging the second capacitor 48. The current $I_1$ can discharge the gate of the first NMOS transistor 42, which can decrease the gate voltage and the channel conduction of the first NMOS transistor 42 and/or cause the NMOS transistor 42 to become disabled (non-conductive) during a transient signal event, and thus not provide a low impedance discharge path to $V_1$.

The circuit 40 can include additional parasitic discharge paths in addition to a path through a parasitic p-n junction diode of the first PMOS transistor 45. For example, when the transient signal event 14 is received on the pad 41, the voltage of the second power supply $V_2$ can be coupled upwards for a variety of reasons, including capacitive coupling and/or through discharge paths such as the discharge path associated with $I_1$ described above. The increase in the second supply voltage $V_2$ can lead to an increase in the voltage used to bias the second NMOS transistor 44. For example, when the control signal CONTROL is in a low state, the voltage level of the CONTROL_B node can be equal to about that of the second supply voltage $V_2$. Thus, an increase in the second supply voltage $V_2$ can lead to an increase in the channel conductivity of the second NMOS transistor 44, which can increase a current $I_2$ flowing from the gate of the first NMOS transistor 42 to the first power supply voltage $V_1$ through the second NMOS transistor 44. Additionally, even in configurations in which the control signal CONTROL is initially biased in a high state, an increase in the second supply voltage $V_2$ beyond normal conditions can activate a control loop of the integrated circuit (not illustrated in FIG. 2) that can set the state of the control signal CONTROL to a start-up condition, which can be a state associated with activation of the second NMOS transistor 44. Thus, in certain implementations, a transient signal event can couple to the second power supply voltage $V_2$ and increase the supply voltage, thereby leading to the activation of the second NMOS transistor 44 and a discharge of the gate of the first NMOS transistor 42.

Parasitic discharge paths on the gate of an NMOS transistor electrically connected to a pad of an IC can lead to the NMOS transistor failing to activate during a transient signal event or deactivating at some point during a transient signal event. Since failure of the NMOS transistor to turn-on and form a channel to provide protection can lead to damage to the NMOS transistor and/or to other circuits and components electrically connected to the pad, there is a need for improved MOS output circuits. Furthermore, there is a need for an output MOS circuit architecture having improved reliability while maintaining the gate controls provided by a pre-driver circuit.

Overview of MOS Transistor Protection Circuits

MOS protection circuits and methods of forming the same are provided. In certain implementations, a protection circuit includes a MOS transistor electrically connected to a pad and a control circuit configured to control the gate of the MOS transistor. The control circuit includes one or more transistors configured to prevent the gate of the MOS transistor from discharging during a transient signal event due to parasitic leakage paths. Removing parasitic leakage paths allows charge coupled onto the gate of the MOS transistor during a transient signal event to remain on the gate of the MOS transistor for the duration of the event, thereby helping to maintain the potential of the gate of the MOS transistor at a level sufficient to enable the transistor and provide transient signal protection.

Figure 3A:
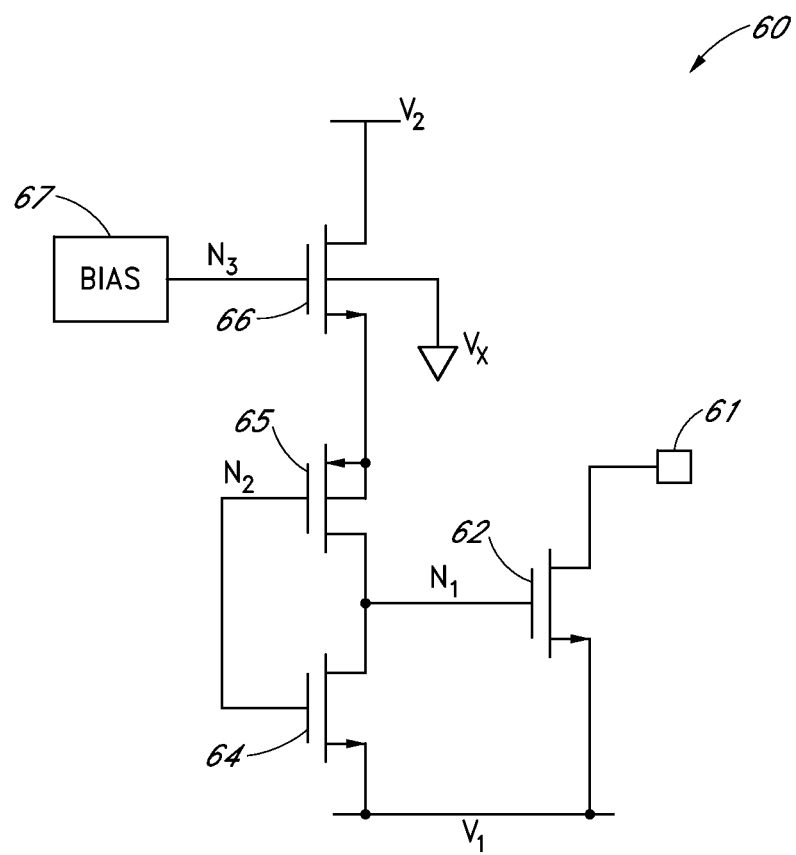
FIG. 3A is a schematic block diagram of an NMOS protection circuit in accordance with one embodiment.

FIG. 3A is a schematic block diagram of an NMOS protection circuit 60 in accordance with one embodiment. The NMOS protection circuit 60 includes a pad 61, a first NMOS transistor 62, a second NMOS transistor 64, a PMOS transistor 65, a third NMOS transistor 66, and a bias circuit 67. The pad 61 can be any suitable pad, including, for example, the first pad 4 of FIGS. 1A-1B and/or the pad 6 of FIG. 1C.

The first NMOS transistor 62 includes a drain electrically connected to the pad 61, a source electrically connected to the first power supply voltage $V_1$, and a gate electrically connected to a drain of the second NMOS transistor 64 and to a drain of the PMOS transistor 65 at a node labeled $N_1$. The second NMOS transistor 64 further includes a source electrically connected to the first power supply voltage $V_1$ and a gate electrically connected to a node $N_2$. The PMOS transistor 65 further includes a gate electrically connected to the node $N_2$ and a source and body electrically connected to a source of the third NMOS transistor 66. The third NMOS transistor 66 further includes a gate electrically connected to an output of the bias circuit 67 at a node $N_3$, a drain electrically connected to the second power supply voltage $V_2$, and a body electrically connected to a reference voltage $V_X$. The reference voltage $V_X$ can be any suitable voltage lower than $V_2$, including, for instance, the first power supply voltage $V_1$.

The first and second power supply voltages $V_1$, $V_2$ can be any suitable nodes. For example, the first power supply voltage $V_1$ can be a low-impedance ground or power supply node configured to shunt the charge associated with a transient signal event when the transient signal event is received on the pad 61. The second power supply voltage $V_2$ can be, for example, a low-impedance power supply node. However, in certain implementations, the second power supply voltage $V_2$ need not be low-impedance, since the second power supply voltage $V_2$ need not be configured to shunt the charge associated with a transient signal event.

The node $N_1$ can be used to control the gate of the first NMOS transistor 62, thereby controlling the electrical potential of the pad 61. To aid in controlling the potential of the node $N_1$, the node $N_1$ can be electrically connected to one or more transistors or other devices configured to operate as control circuitry for the first NMOS transistor 62. For example, as illustrated in FIG. 3A, the second NMOS transistor 64 and the PMOS transistor 65 have been configured to logically invert a signal received on the node $N_2$, which can be a control node, such as the node CONTROL_B shown in FIG. 2.

The third NMOS transistor 66 has been disposed between the source and body of the PMOS transistor 65 and the second power supply voltage $V_2$. During normal operation of the circuit with the absence of a transient signal event, the bias circuit 67 can be configured to provide a boosted voltage onto the node $N_3$ such that the third NMOS transistor 66 provides a low impedance path between the second power supply voltage $V_2$ and the source of the PMOS transistor 65. Thus, inclusion of the third NMOS transistor 66 need not hinder operation of the second NMOS transistor 64 and the PMOS transistor 65 during normal operation of the circuit. In certain implementations, the bias circuit 67 is configured to provide a voltage to the gate of the third NMOS transistor 66 that is about 1.3 to about 1.8 times greater than the second power supply voltage $V_2$. For example, the bias circuit 67 can utilize a charge pump circuit.

The bias circuit 67 can be implemented in any suitable manner. For example, the bias circuit can include a current source of a predefined value and a series combination of a dummy NMOS transistor and a dummy PMOS transistor similar to the NMOS transistor 66 and the PMOS transistor 65, respectively. The current source can be electrically connected to the drain of the dummy NMOS transistor, and the bias circuit 67 can be configured to control the gate voltage of the dummy NMOS transistor until the dummy NMOS transistor is biased at a gate voltage sufficient for the current to pass through the dummy NMOS and dummy PMOS transistors. However, the bias circuit 67 need not include a control loop, and can be implemented in other ways. For example, in configurations having suitable circuit conditions, the bias circuit 67 can be configured to provide a voltage equal to about $V_2$ to the gate of the NMOS transistor 66.

In one embodiment, the bias circuit 67 biases the gate of the NMOS transistor 66 beyond a process-rated gate voltage of the NMOS transistor 66. For example, the NMOS transistor 66 can be in an on-state and include an inversion layer that can reduce the impact of a body-gate voltage on the voltage across the gate oxide. Thus, the NMOS transistor 66 can be biased to a gate voltage greater than that of an NMOS transistor of similar geometry and gate oxide thickness that is biased in an off-state. In certain implementations, the bias circuit 67 can bias the gate of the NMOS transistor 66 to up to about 1.5 times the process rated gate voltage. For example, the bias circuit 67 can be configured to bias the gate of the NMOS transistor 66 to a voltage between about 1.0 and about 1.5 times the maximum rated gate-source voltage for transistors having about the same gate oxide thickness as the NMOS transistor 66.

Inclusion of the third NMOS transistor 66 can aid in reducing parasitic leakage paths that may otherwise discharge the gate of the first NMOS transistor 62 during a transient signal event. For example, the PMOS transistor 65 can include a parasitic p-n junction diode disposed between the drain and body of the PMOS transistor 65. During a transient signal event, the gate-drain capacitance of the first NMOS transistor 62 can couple the node $N_1$ upwards, thereby boosting the drain voltage of the PMOS transistor 65 above that of the body of the PMOS transistor 65. This in turn can lead to p-n junction diode becoming forward biased and providing a current from the drain to the body, as was described earlier with respect to FIG. 2.

By disposing the third NMOS transistor 66 in series between the body of the PMOS transistor 65 and the second power supply voltage $V_2$, the third NMOS transistor 66 can block a flow of current from the body of the PMOS transistor 65 to the second power supply voltage $V_2$. For example, as the body voltage of the PMOS transistor 65 rises during a transient signal event, the source voltage of the third NMOS transistor 66 can rise as well. The source of the third NMOS transistor 66 can rise to the point where the gate-source voltage of the third NMOS transistor 66 falls below the threshold voltage of the third NMOS transistor 66 such that the third NMOS transistor 66 enters a high-impedance cut-off mode of operation. Thus, the third NMOS transistor 66 can be used to remove parasitic discharge paths during a transient signal event received on the pad 61, thereby improving the robustness of the protection provided by the first NMOS transistor 62 by keeping the coupled gate voltage great enough for MOS conduction during the transient signal event.

Figure 3B:
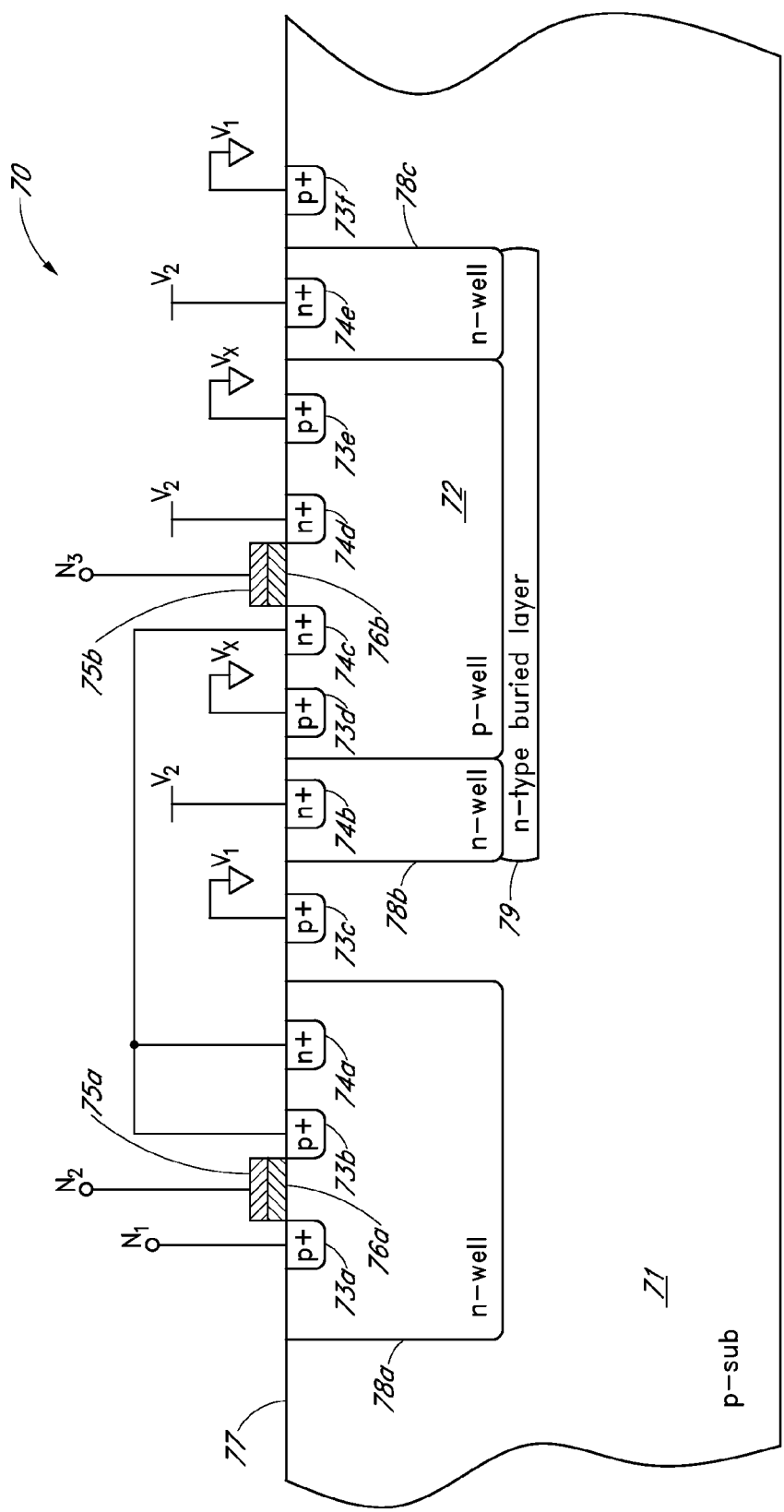
FIG. 3B is a cross section of one implementation of a portion of the NMOS protection circuit of FIG. 3A.

FIG. 3B is a cross section 70 of one implementation of a portion of the NMOS protection circuit 60 of FIG. 3A. The illustrated cross section 70 illustrates one implementation of the PMOS transistor 65 and the third NMOS transistor 66 of FIG. 3A. The cross section 70 includes a p-type substrate 71, n-type active areas 74a-74e, p-type active areas 73a-73f, n-wells 78a-78c, p-well 72, n-type buried layer 79, gates 75a, 75b, and gate oxides 76a, 76b. The cross section has been annotated to illustrate electrical connections to the gates 75a, 75b, to the n-type active regions 74a-74e, and to the p-type active regions 73a-73f. In some implementations, the n-type buried layer 79 can be omitted, including, for instance, in implementations in which the first power supply voltage $V_1$ is used as the reference voltage $V_X$.

As illustrated in FIG. 3B, the p-well 72 is disposed on a surface 77 of the substrate 71. The n-wells 78b, 78c are disposed on the surface 77 of the substrate 71 adjacent the p-well 72 on opposite sides of the p-well 72. In certain implementations, the n-wells 78b, 78c form part of a ring that surrounds the p-well 72 when the p-well 72 is viewed from above the substrate 71. In the illustrated implementation, the n-type buried layer 79 is disposed beneath the n-wells 78b, 78c and the p-well 72. The n-well 78a is disposed on the surface 77 of the substrate 71 adjacent the n-well 78b. The gate oxide 76a is disposed over the surface 77 of the substrate 71 above the n-well 78a, and the gate 75a is disposed over the gate oxide 76a. The p-type active areas 73a, 73b are disposed in the n-well 78a on opposite sides of the gate 75a. The n-type active area 74a is disposed in the n-well 78a adjacent the p-type active area 73b. The p-type active area 73c is disposed on a surface 77 of the substrate 71 adjacent the n-well 78b, and the p-type active area 73f is disposed on a surface 77 of the substrate 71 adjacent the n-well 78c.

The gate oxide 76b is disposed over the surface 77 of the substrate 71 above the p-well 72, and the gate 75b is disposed over the gate oxide 76b. The n-type active areas 74c, 74d are disposed in the p-well 72 on opposite sides of the gate 75b. The p-type active areas 73d, 73e are disposed in the p-well 72 adjacent the n-type active regions 74c, 74d, respectively. The n-type active regions 74b, 74e are disposed in the n-wells 78b, 78c, respectively.

The p-type active area 73a is electrically connected to the node $N_1$, the gate 75a is electrically connected to the node $N_2$, and the gate 75b is electrically connected to the node $N_3$. The p-type actives areas 73c-73f are electrically connected to the first power supply voltage $V_1$, and the n-type active areas 74b, 74d, 74e are electrically connected to the second power supply voltage $V_2$. The p-type active area 73b is electrically connected to the n-type actives areas 74a, 74c.

The n-wells 78a, 78b and the n-type buried layer 79 can aid in electrically isolating the p-well 72 from the p-type substrate 71, thereby permitting the p-type substrate 71 and the p-well 72 to operate at different electrical potentials. For example, inclusion of the n-type buried layer 79 permits the body of the NMOS device formed from the p-well 72 to be electrically connected to a different potential. As used herein, and as will be understood by one of skill in the art, the term "n-type buried layer" refers to any suitable n-type buried layer, including, for example, those used in silicon-on-insulator (SOI) technologies or in deep n-well technologies.

The illustrated cross section 70 illustrates one implementation of the PMOS transistor 65 and the third NMOS transistor 66 of FIG. 3A. For example, the gate 75a, the p-type active area 73a, the p-type active area 73b and the n-well 78a can operate as the gate, drain, source and body of the PMOS transistor 65 of FIG. 3A, and the gate 75b, the n-type active area 74d, the n-type active area 74c, and the p-well 72 can operate as the gate, drain, source and body of the third NMOS transistor 66 of FIG. 3A. Although one implementation of the PMOS transistor 65 and the third NMOS transistor 66 of FIG. 3A is shown in FIG. 3B, other implementations are possible. Additionally, certain details have been omitted from FIG. 3B for clarity. For example, the cross section 70 can undergo back end processing to form contacts and metallization, which can be used to form the illustrated connections. Additionally, the cross section 70 can include isolation regions, such as shallow trench regions, deep trench regions or local oxidation of silicon (LOCOS) regions for separating regions, isolating regions, and/or reducing static current leakage between active areas connected to different electrical nodes. Formation of the isolation regions can involve etching trenches in the substrate 71, filling the trenches with a dielectric, such as silicon dioxide, and removing the excess dielectric using any suitable method, such as chemical-mechanical planarization.

Figure 4:
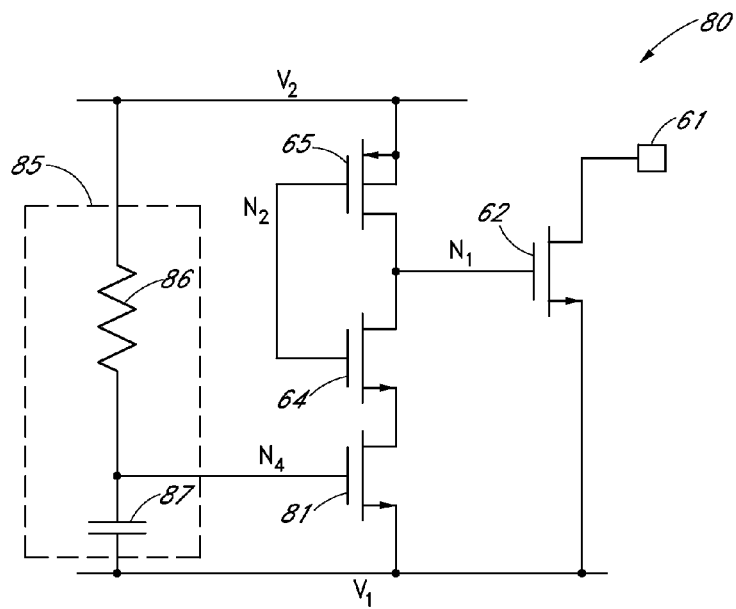
FIG. 4 is a schematic block diagram of an NMOS protection circuit in accordance with another embodiment.

FIG. 4 is a schematic block diagram of an NMOS protection circuit 80 in accordance with another embodiment. The NMOS protection circuit 80 includes the pad 61, the first NMOS transistor 62, the second NMOS transistor 64, the PMOS transistor 65, a fourth NMOS transistor 81, and a filter circuit 85. The third NMOS transistor 66 and the bias circuit 67 of FIG. 3A are not included in this embodiment.

The first NMOS transistor 62 includes a drain electrically connected to the pad 61, a source electrically connected to the first power supply voltage $V_1$, and a gate electrically connected to a drain of the second NMOS transistor 64 and to a drain of the PMOS transistor 65 at a node labeled $N_1$. The second NMOS transistor 64 further includes a source electrically connected to a drain of the fourth NMOS transistor 81 and a gate electrically connected to a node $N_2$. The fourth NMOS transistor 81 further includes a source electrically connected to the first power supply voltage $V_1$ and a gate electrically connected to an output of the filter circuit 85 at a node $N_4$. The PMOS transistor 65 further includes a gate electrically connected to the node $N_2$ and a source and body electrically connected to the second power supply voltage $V_2$. Additional details of the first and second nodes $N_1$, $N_2$ and the first and second power supply voltages $V_1$, $V_2$ can be as described above with reference to FIG. 3A.

Figure 5:
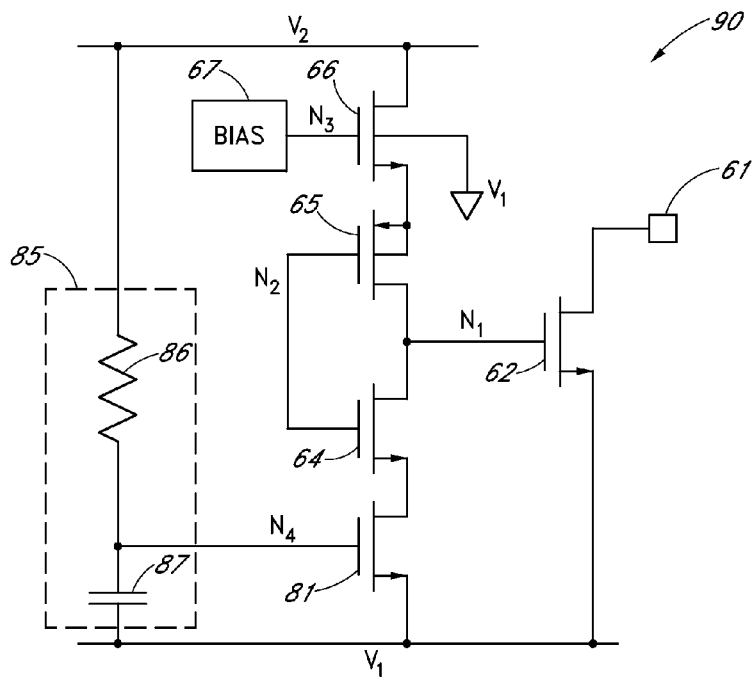
FIG. 5 is a schematic block diagram of an NMOS protection circuit in accordance with yet another embodiment.

The illustrated filter circuit 85 includes a resistor 86 and a capacitor 87. The resistor 86 includes a first end electrically connected to the second power supply voltage $V_2$ and a second end electrically connected to a first end of the capacitor 87 and to the gate of the fourth NMOS transistor 81 at the node $N_4$. The capacitor 87 further includes a second end electrically connected to the first power supply voltage $V_1$. The illustrated filter circuit 85 can filter the second power supply voltage $V_2$ to generate a filtered supply voltage on the node $N_4$. Although one particular implementation of the filter circuit 85 is illustrated in FIG. 5, the filter circuit 85 can be any suitable filter, including, for example, any suitable low pass filter.

The fourth NMOS transistor 81 has been disposed between the source of the second NMOS transistor 64 and the first power supply voltage $V_1$. During normal operation of the circuit and in the absence of a transient signal event, the filter circuit 85 can provide a voltage to the node $N_4$ that is equal to about the second power supply voltage $V_2$. Thus, during normal operation, the fourth NMOS transistor 81 can be enabled and need not hinder the operation of the second NMOS transistor 64 and the PMOS transistor 65 as an inverter during normal operation. In certain implementations, the resistor has a resistance ranging between about 150 kΩ to about 300 kΩ, for instance, about 250 kΩ, and the capacitor has a capacitance ranging between about 1.5 pF to about 2.5 pF, for instance, about 2.0 pF.

Inclusion of the fourth NMOS transistor 81 and the filter circuit 85 can aid in reducing parasitic leakage paths that may otherwise discharge the gate of the first NMOS transistor 62 during a transient signal event. For example, when a transient signal event is received on the pad 61, the voltage of the second power supply $V_2$ can be coupled upwards, as was described earlier. The increase in the second supply voltage $V_2$ can lead to an increase in the voltage used to bias the second NMOS transistor 64, since the node $N_2$ can be controlled by a control circuit having an output equal to about that of the second supply voltage $V_2$. Additionally, in certain implementations, an increase in the second supply voltage $V_2$ can activate a control loop of the integrated circuit used during start-up that can set the state of the node $N_2$ to a start-up condition, which can be a state associated with activation of the second NMOS transistor 64. Thus, in certain implementations, a transient signal event can couple to the second power supply voltage $V_2$ and increase the supply voltage, thereby leading to the activation of the second NMOS transistor 64 and a discharge of the gate of the first NMOS transistor 62 during a transient signal event.

By disposing the fourth NMOS transistor 81 in series between the source of the second NMOS transistor 64 and the first power supply voltage $V_1$ with the gate of the fourth NMOS transistor 81 connected to the output of the filter circuit 85, the potential of the node $N_4$ can remain relatively low during a transient signal event, thereby keeping the gate voltage of the fourth NMOS transistor 81 at a relatively low level for the duration of the transient signal event. Since the second and fourth NMOS transistors 64, 81 are electrically connected in series the fourth NMOS transistor 81, filtering the voltage provided to the gate of the fourth NMOS transistor 81 can limit the discharge of current from the gate of the first NMOS transistor 62 during a transient signal event, even when the transient signal event causes the voltage of the node $N_2$ and/or the second power supply voltage $V_2$ to increase. Thus, the fourth NMOS transistor 81 can be used to remove parasitic discharge paths during a transient signal event received on the pad 61, thereby improving the robustness of the protection provided by the first NMOS transistor 62.

FIG. 5 is a schematic block diagram of an NMOS protection circuit 90 in accordance with yet another embodiment. The NMOS protection circuit 90 includes the pad 61, the first NMOS transistor 62, the second NMOS transistor 64, the third NMOS transistor 66, the fourth NMOS transistor 81, the PMOS transistor 65, the bias circuit 67, and the filter circuit 85.

The first NMOS transistor 62 includes a drain electrically connected to the pad 61, a source electrically connected to the first power supply voltage $V_1$, and a gate electrically connected to a drain of the second NMOS transistor 64 and to a drain of the PMOS transistor 65 at a node labeled $N_1$. The second NMOS transistor 64 further includes a source electrically connected to a drain of the fourth NMOS transistor 81 and a gate electrically connected to a node $N_2$. The fourth NMOS transistor 81 further includes a source electrically connected to the first power supply voltage $V_1$ and a gate electrically connected to a first end of the resistor 86 and to a first end of the capacitor 87 at a node $N_4$. The capacitor 87 further includes a second end electrically connected to the first power supply voltage $V_1$, and the resistor 86 further includes a second end electrically connected to the second power supply voltage $V_2$. The PMOS transistor 65 further includes a gate electrically connected to the node $N_2$ and a source and body electrically connected to a source of the third NMOS transistor 66. The third NMOS transistor 66 further includes a gate electrically connected to an output of the bias circuit 67 at a node $N_3$, a drain electrically connected to the second power supply voltage $V_2$, and a body electrically connected to the first power supply voltage $V_1$.

The illustrated NMOS protection circuit 90 has been configured to reduce or remove parasitic leakage paths that may otherwise discharge the gate of the first NMOS transistor 62 during a transient signal event. For example, the illustrated NMOS protection circuit 90 includes the third NMOS transistor 66 and the bias circuit 67, which can be used to reduce a parasitic leakage path from the gate of the first NMOS transistor 62 to the second power supply voltage $V_2$ through the body of the PMOS transistor 65. Additionally, the illustrated NMOS protection circuit 90 includes the fourth NMOS transistor 81 and the filter circuit 85, which can be used to reduce a parasitic leakage path from the gate of the first NMOS transistor 62 to the first power supply voltage $V_1$ through the second NMOS transistor 64. Additional details of the NMOS protection circuit 90 can be similar to those described above with respect to FIGS. 3A-4 above. Although FIG. 5 is illustrated for a configuration in which the body of the third NMOS transistor 66 has been electrically connected to the first power supply voltage $V_1$, the body of the third NMOS transistor 66 can be electrically connected to other nodes, as was described earlier.

Although FIGS. 3A-5 have described leakage reduction schemes in terms of an NMOS transistor electrically connected to a pad, the leakage reduction schemes can be applied to a PMOS transistor configuration and to a combination of an output driver NMOS and PMOS connected to a common output pad, such as in the configuration shown in FIG. 1C.

Figure 6:
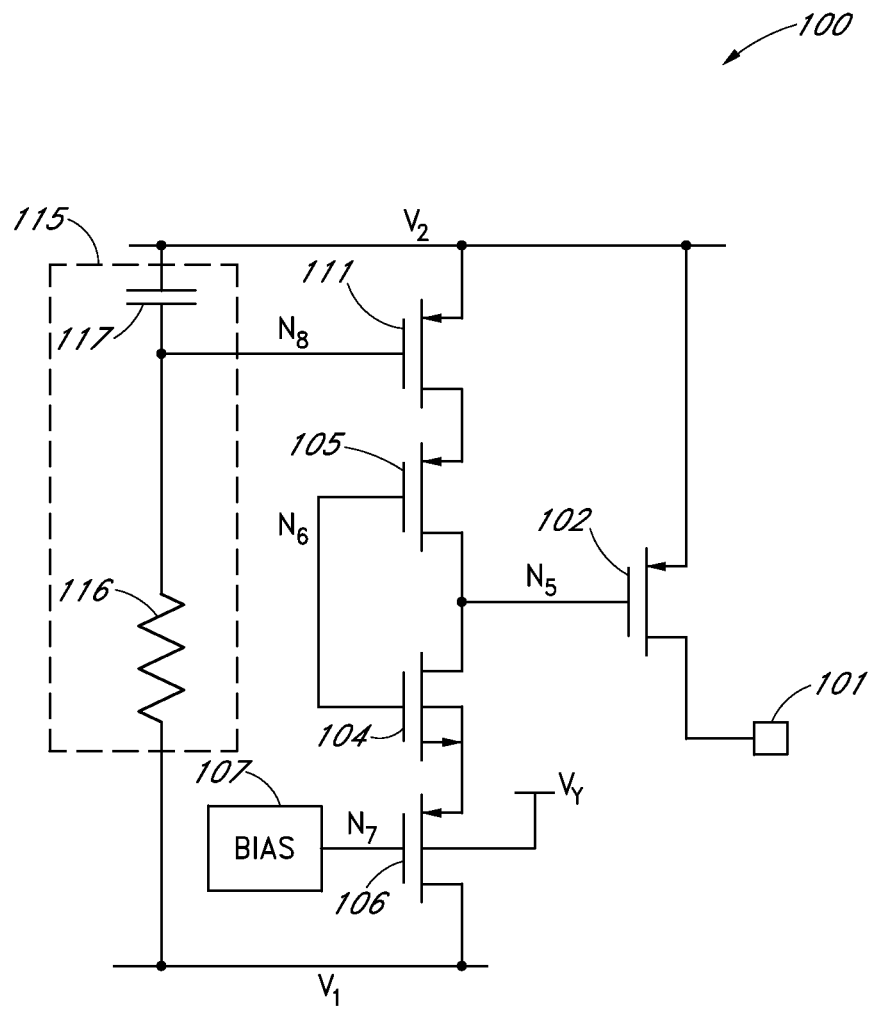
FIG. 6 is a schematic block diagram of a p-type metal oxide semiconductor (PMOS) protection circuit in accordance with one embodiment.

FIG. 6 is a schematic block diagram of a p-type metal oxide semiconductor (PMOS) protection circuit 100 in accordance with one embodiment. The PMOS protection circuit 100 includes a pad 101, a first PMOS transistor 102, the second PMOS transistor 105, the third PMOS transistor 106, a fourth PMOS transistor 111, the NMOS transistor 104, the bias circuit 107, and the filter circuit 115. The filter circuit 115 includes a resistor 116 and a capacitor 117.

The first PMOS transistor 102 includes a drain electrically connected to the pad 101, a source electrically connected to the second power supply voltage $V_2$, and a gate electrically connected to a drain of the second PMOS transistor 105 and to a drain of the NMOS transistor 104 at a node labeled $N_5$. The second PMOS transistor 105 further includes a source electrically connected to a drain of the fourth PMOS transistor 111 and a gate electrically connected to a node $N_6$. The fourth PMOS transistor 111 further includes a source electrically connected to the second power supply voltage $V_2$ and a gate electrically connected to a first end of the resistor 116 and to a first end of the capacitor 117 at a node $N_8$. The capacitor 117 further includes a second end electrically connected to the second power supply voltage $V_2$, and the resistor 116 further includes a second end electrically connected to the first power supply voltage $V_1$. The NMOS transistor 104 further includes a gate electrically connected to the node $N_6$ and a source and body electrically connected to a source of the third PMOS transistor 106. The third PMOS transistor 106 further includes a gate electrically connected to an output of the bias circuit 107 at a node $N_7$, a drain electrically connected to the first power supply voltage $V_1$, and a body electrically connected to a reference voltage $V$. The reference voltage $V_y$ can be any suitable voltage greater than $V_1$, including, for instance, the second power supply voltage $V_2$.

The illustrated PMOS protection circuit 100 has been configured to reduce or remove parasitic leakage paths that may otherwise charge the gate of the first PMOS transistor 102 during a transient signal event. For example, the illustrated PMOS protection circuit 100 includes the third PMOS transistor 106 and the bias circuit 107, which can be used to reduce a parasitic leakage path from the gate of the first PMOS transistor 102 to the first power supply voltage $V_1$ through the body of the NMOS transistor 104. Additionally, the illustrated PMOS protection circuit 100 includes the fourth PMOS transistor 111 and the filter circuit 115, which can be used to reduce a parasitic leakage path from the gate of the first PMOS transistor 102 to the second power supply voltage $V_2$ through the second PMOS transistor 105. Additional details of the PMOS protection circuit 100 can be similar to those described above with respect to FIGS. 3A-4 above.

In certain implementations, a PMOS protection circuit and an NMOS protection circuit can be included on an IC. For example, in the configurations shown in FIGS. 1A-1C, an IC can include both PMOS and NMOS output drivers, and each of these output drivers can incorporate the protection schemes described herein. Providing both a PMOS protection circuit and an NMOS protection circuit can aid in protecting supply voltages of an IC from transient signal events. For example, when a transient signal event causes the supply voltage $V_2$ to increase and the supply voltage $V_1$ to decrease, both the PMOS and the NMOS can become activated and a low impedance discharge path can be provided between the first and second supply voltages $V_1$, $V_2$.

Figure 7A:
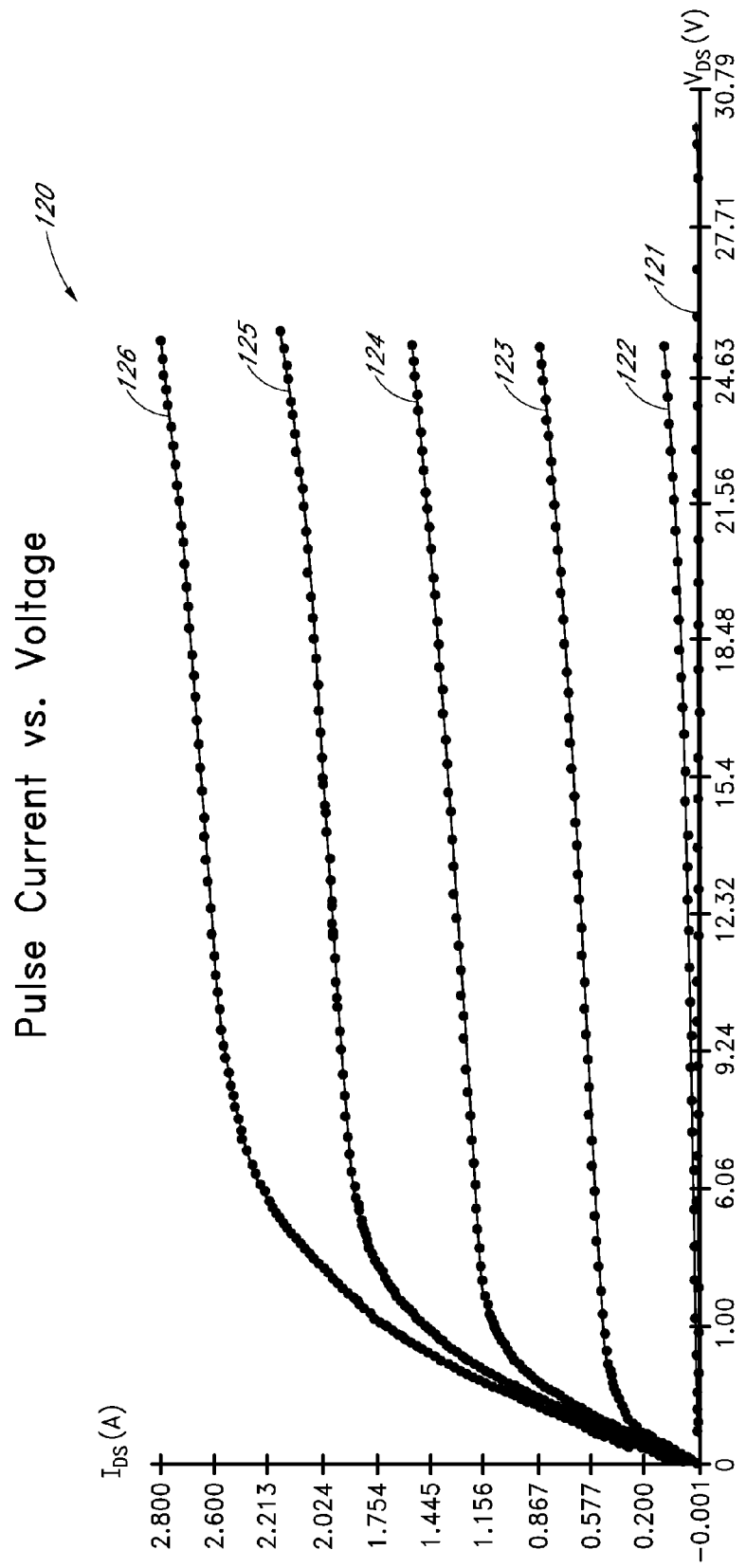
FIG. 7A is a graph of one example of drain-source current versus drain-source voltage for an NMOS transistor.

FIG. 7A is a graph 120 of one example of drain-source current versus drain-source voltage for an NMOS transistor. The graph 120 illustrates transmission line pulsed (TLP) measurements with about a 2 ns rise time and about a 100 ns pulse width. The NMOS transistor is characterized for different gate voltage coupling conditions, and has a width of about 10,000 um. The NMOS transistor is configured to operate at a voltage of up to about 20 V, and can withstand certain transient signal events, such as a 2 kV human body model (HBM) ESD event. The illustrated plots 121-126 illustrate drain-source current for gate-source coupling voltages of about 0 V, about 1 V, about 2 V, about 3 V, about 4 V, and about 5 V, respectively. Although FIG. 7A illustrates a configuration in which the NMOS transistor has been configured to operate at a voltage of up to about 20 V, the NMOS transistor can be configured to operate at any suitable voltage, including, for example, voltages of up to about 200 V. Additionally, the NMOS transistor can be configured to withstand transient signal events of a greater magnitude, including, for example, ESD events greater than 8 kV HBM. The plot 121 shows that for a very low gate voltage the device reaches a breakdown condition while maintaining a very low current. Additionally, for the plots 122-126 in which the device receives a larger gate voltage, the device is able to conduct a relatively large amount of current suitable to provide protection against certain transient signal events, thereby allowing the device to be self-protected.

Figure 7B:
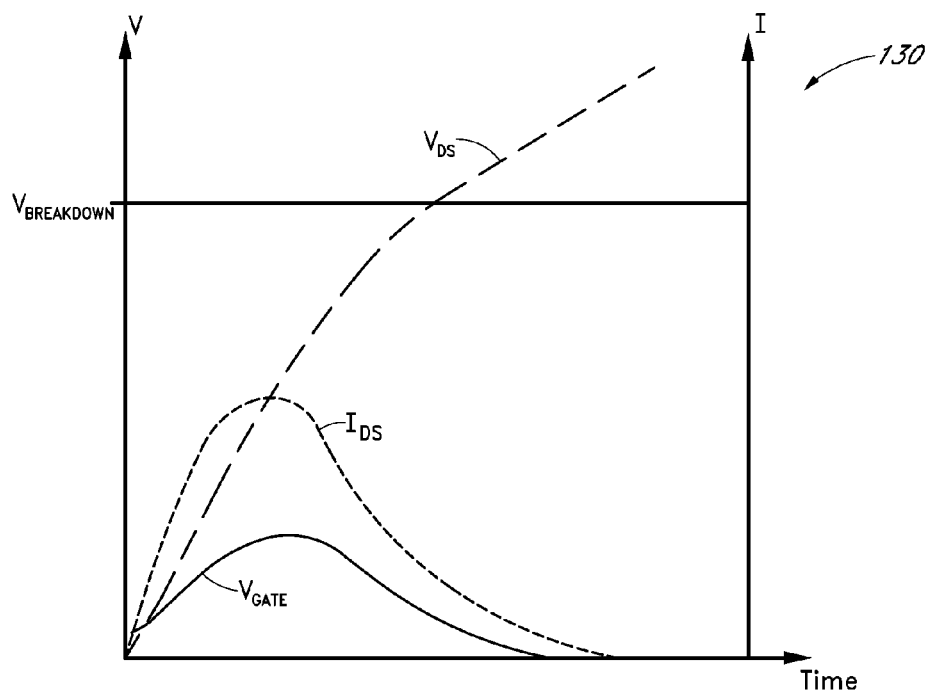
FIG. 7B is a graph of one example of drain-source current, drain-source voltage, and gate voltage versus time.

FIG. 7B is a graph 130 of one example of drain-source current, drain-source voltage, and gate voltage versus time. The graph 130 illustrates the operation of an NMOS transistor during a transient signal event that begins at time zero. As shown in FIG. 7B, the transient signal event can increase the drain-source voltage $V_{DS}$ of the transistor over time. The increase in the drain-source voltage $V_{DS}$ can lead to the voltage of the gate $V_{GATE}$ being coupled upwards, which can increase the drain-source channel current $I_{DS}$. However, as described earlier, parasitic leakage paths on the gate of an NMOS transistor can reduce the gate voltage during a transient signal event. Reducing the gate voltage can decrease the drain-source channel current $I_{DS}$ and lead to an increase in the drain-source voltage $V_{DS}$ beyond a breakdown voltage $V_{BREAKDOWN}$ associated with device damage.

Figure 7C:
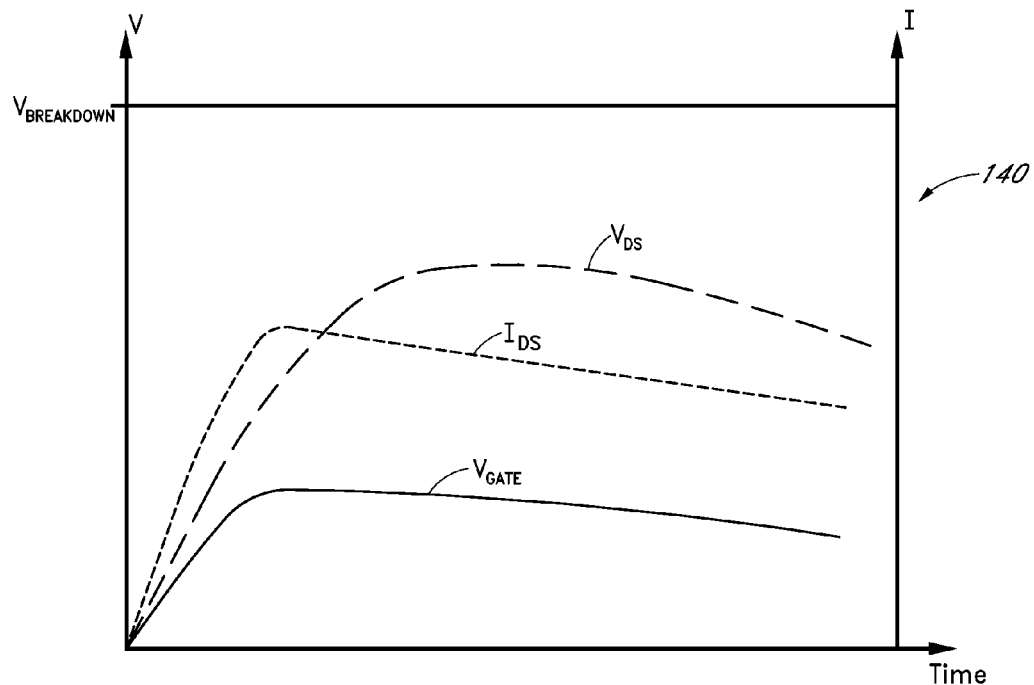
FIG. 7C is a graph of another example of drain-source current, drain-source voltage, and gate voltage versus time.

FIG. 7C is a graph 140 of another example of drain-source current, drain-source voltage, and gate voltage versus time. The graph 140 illustrates the operation of an NMOS transistor during a transient signal event that begins at time zero. As shown in FIG. 7C, the transient signal event can increase the drain-source voltage $V_{DS}$ of the transistor over time. The increase in the drain-source voltage $V_{DS}$ can lead to the voltage of the gate $V_{GATE}$ being coupled upwards, which can increase the drain-source channel current $I_{DS}$. In the configuration illustrated in FIG. 7C, the parasitic leakage paths from the gate of the NMOS transistor during the transient signal event have been reduced relative to that shown in FIG. 7B. Thus, the voltage of the gate $V_{GATE}$ of the NMOS transistor decreases at a slower rate over time relative to the gate voltage shown in FIG. 7B. Thus, the drain-source channel current $I_{DS}$ can remain relatively high over time, which can lead to the drain-source voltage $V_{DS}$ decreasing and not reaching the voltage $V_{BREAKDOWN}$ associated with device damage.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit comprising:
   a first pad disposed above a surface of a substrate;
   a first metal oxide semiconductor (MOS) transistor of the substrate and of a first type, the first MOS transistor including a gate, a source, and a drain, the drain electrically connected to the first pad and the source electrically connected to a first supply voltage;
   a second MOS transistor of the substrate and of a second type opposite the first type, the second MOS transistor including a gate, a source, a drain, and a body, the gate configured to receive a control signal and the drain electrically connected to the gate of the first MOS transistor;

a third MOS transistor of the substrate and of the first type, the third MOS transistor including a gate, a drain, a source, and a body, the gate configured to receive a bias signal, the drain electrically connected to a second supply voltage, the source electrically connected to the source of the second MOS transistor, and the body electrically connected to a first reference voltage; and a fourth MOS transistor of the substrate and of the first type, the fourth MOS transistor including a gate, a drain, and a source, the gate electrically connected to the control signal and the drain electrically connected to the gate of the first MOS transistor;

wherein the body of the second MOS transistor is electrically connected to the source of the third MOS transistor so as to prevent a current flowing from the drain of the second MOS transistor to the second supply voltage through the body of the second MOS transistor when a transient signal event is received on the first pad.

2. The integrated circuit of claim 1, further comprising a fifth MOS transistor and a filter circuit configured to filter the second supply voltage to generate a filtered output, the fifth MOS transistor of the substrate and of the first type, the fifth MOS transistor including a gate, a drain, and a source, the gate electrically connected to the filtered output, the drain electrically connected to the source of the fourth MOS transistor, and the source electrically connected to the first supply voltage.

3. The integrated circuit of claim 2, wherein the filter circuit comprises a resistor and a capacitor, the resistor including a first end electrically connected to the second supply voltage and a second end electrically connected to a first end of the capacitor and to the gate of the fifth MOS transistor at the filtered output, wherein the capacitor further includes a second end electrically connected to the first supply voltage, the resistor and capacitor configured to filter the second supply voltage when the transient signal event is received on the first pad.

4. The integrated circuit of claim 3, wherein the resistor has a resistance ranging between about 150 kΩ to about 300 kΩ, and the capacitor has a capacitance ranging between about 1.5 pF to about 2.5 pF.

5. The integrated circuit of claim 1, wherein the first MOS transistor is a high voltage double-diffused MOS (DMOS) transistor.

6. The integrated circuit of claim 1, wherein the bias signal has a voltage level selected such that a magnitude of a voltage between the gate and the source of the third MOS transistor is between about 1.0 and about 1.5 times a maximum rated gate-source voltage of the third MOS transistor.

7. The integrated circuit of claim 1, wherein the first type is p-type and the second type is n-type.

8. The integrated circuit of claim 1, wherein the first type is n-type and the second type is p-type.

9. The integrated circuit of claim 8, wherein the first supply voltage is a ground supply and the second supply voltage is a positive supply voltage.

10. The integrated circuit of claim 1, wherein the first reference voltage is the first supply voltage.

11. A method for providing protection from transient signal events, the method comprising:

forming a first pad above a surface of a substrate;

forming a first metal oxide semiconductor (MOS) transistor on the substrate, the first MOS transistor of a first type and including a gate, a source, and a drain, the drain electrically connected to the first pad and the source electrically connected to a first supply voltage;

forming a second MOS transistor on the substrate, the second MOS transistor of a second type opposite the first type and including a gate, a source, a drain, and a body, the gate configured to receive a control signal and the drain electrically connected to the gate of the first MOS transistor;

forming a third MOS transistor on the substrate, the third MOS transistor of the first type and including a gate, a drain, a source, and a body, the gate configured to receive a bias signal, the drain electrically connected to a second supply voltage, the source electrically connected to the source of the second MOS transistor, and the body electrically connected to a first reference voltage; and forming a fourth MOS transistor on the substrate, the fourth MOS transistor of the first type and including a gate, a drain, and a source, the gate electrically connected to the control signal and the drain electrically connected to the gate of the first MOS transistor;

wherein the body of the second MOS transistor is electrically connected to the source of the third MOS transistor so as to prevent a current flowing from the drain of the second MOS transistor to the second supply voltage through the body of the second MOS transistor when a transient signal event is received on the first pad.

12. The method of claim 11, further comprising forming a fifth MOS transistor on the substrate, the fifth MOS transistor of the first type and including a gate, a drain, and a source, the gate configured to receive a filtered version of the second supply voltage, the drain electrically connected to the source of the fourth MOS transistor, and the source electrically connected to the first supply voltage.

13. The method of claim 12, further comprising providing a filter including a resistor and a capacitor, the resistor including a first end electrically connected to the second supply voltage and a second end electrically connected to a first end of the capacitor and to the gate of the fifth MOS transistor at the filtered output, wherein the capacitor further includes a second end electrically connected to the first supply voltage, the resistor and capacitor configured to filter the second supply voltage when the transient signal event is received on the first pad so as to prevent the fourth MOS transistor from charging or discharging the gate of the first MOS transistor during the transient signal event.

14. The method of claim 13, wherein the resistor has a resistance ranging between about 150 kΩ to about 300 kΩ, and the capacitor has a capacitance ranging between about 1.5 pF to about 2.5 pF.

15. The method of claim 11, wherein the first MOS transistor is a high voltage double-diffused MOS (DMOS) transistor.

16. The method of claim 11, wherein the bias signal has a voltage level selected such that a magnitude of a voltage between the gate and the source of the third MOS transistor is between about 1.0 and about 1.5 times a maximum rated gate-source voltage of the third MOS transistor.

17. The method of claim 11, wherein the first type is p-type and the second type is n-type.

18. The method of claim 11, wherein the first type is n-type and the second type is p-type.

19. The method of claim 11, wherein the first reference voltage is the first supply voltage.

* * * * *